(12) United States Patent
Sedaghat et al.

(10) Patent No.: US 11,184,035 B2
(45) Date of Patent: Nov. 23, 2021

(54) SOFT-INPUT SOFT-OUTPUT DECODING OF BLOCK CODES

(71) Applicant: Cisco Technology, Inc., San Jose, CA (US)

(72) Inventors: Mohammad Ali Sedaghat, Erlangen (DE); Andreas Bernhard Bisplinghoff, Forchheim (DE); Glenn Elliot Cooper, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/815,624

(22) Filed: Mar. 11, 2020

(65) Prior Publication Data

US 2021/0288674 A1   Sep. 16, 2021

(51) Int. Cl.
*H03M 13/45* (2006.01)
*H03M 13/11* (2006.01)

(52) U.S. Cl.
CPC ......... *H03M 13/458* (2013.01); *H03M 13/11* (2013.01)

(58) Field of Classification Search
CPC ............................ H03M 13/458; H03M 13/11
See application file for complete search history.

(56) References Cited

U.S. PATENT DOCUMENTS

| | | | |
|---|---|---|---|
| 10,090,862 B2 | 10/2018 | Lin et al. | |
| 2004/0019842 A1* | 1/2004 | Argon | H03M 13/293 714/755 |
| 2006/0020869 A1* | 1/2006 | Desai | H03M 13/3784 714/752 |
| 2006/0020874 A1* | 1/2006 | Desai | H03M 13/453 714/780 |
| 2017/0017545 A1* | 1/2017 | Tanabe | H03M 13/373 |

OTHER PUBLICATIONS

David Chase, "Class of algorithms for decoding block codes with channel measurement information," IEEE Transactions on Information theory 18.1 (1972): 170-182.

Marc P.C. Fossorier, and Shu Lin, "Soft-decision decoding of linear block codes based on ordered statistics," IEEE Transactions on Information Theory 41.5 (1995): 1379-1396.

(Continued)

*Primary Examiner* — Thien Nguyen
(74) *Attorney, Agent, or Firm* — Edell, Shapiro & Finnan, LLC

(57) ABSTRACT

A decoder decodes a soft information input vector represented by an input vector that is binary and that is constructed from the soft information input vector. The decoder stores even parity error vectors that are binary and odd parity error vectors that are binary for L least reliable bits (LRBs) of the input vector. The decoder computes a parity check of the input vector, and selects as error vectors either the even parity error vectors or the odd parity error vectors based at least in part on the parity check. The decoder hard decodes test vectors, representing respective sums of the input vector and respective ones of the error vectors, based on the L LRBs, to produce codewords that are binary for corresponding ones of the test vectors, and metrics associated with the codewords. The decoder updates the soft information input vector based on the codewords and the metrics.

20 Claims, 12 Drawing Sheets

(56) References Cited

OTHER PUBLICATIONS

T. Kaneko, T. Nishijima, H. Inazumi, and S. Hirasawa, "An Efficient Maximum-Likelihood Decoding Algorithm for Linear Block Codes with Algebraic Decoder," IEEE Transaction on Information Theory, pp. 320-327, Mar. 1994.
Ramesh Mahendra Pyndiah, "Near-optimum decoding of product codes: Block turbo codes," IEEE Transactions on communications 46.8 (1998): 1003-1010.
Jaeyong Son, Jun Jin Kong, and Kyeongcheol Yang, "Efficient Decoding of Block Turbo Codes," Journal of Communications and Networks, vol. 20, No. 4, August, pp. 345-353, 2018.
Xu, Changlong, Ying-Chang Liang, and Wing Seng Leon. "A low complexity decoding algorithm for extended turbo product codes." IEEE Transactions on Wireless Communications 7.1 (2008): 43-47.
J. Son, K. Cheun, and K. Yang, "Low-Complexity Decoding of Block Turbo Codes Based on the Chase Algorithm," IEEE Communications Letters, vol. 21, No. 4, pp. 706-709, Apr. 2017.
Pyndiah, Ramesh, Pierre Combelles, and Patrick Adde. "A very low complexity block turbo decoder for product codes." Proceedings of GLOBECOM'96. 1996 IEEE Global Telecommunications Conference. vol. 1. IEEE, 1996.

\* cited by examiner

700

$l_{LRB} = 10$:
$e_1 = (0000000000)$, $e_2 = (1100000000)$, $e_3 = (1010000000)$,
$e_4 = (0110000000)$, $e_5 = (1001000000)$, $e_6 = (0101000000)$,
$e_7 = (1000100000)$, $e_8 = (0011000000)$, $e_9 = (0100100000)$,
$e_{10} = (1000010000)$, $e_{11} = (0010100000)$, $e_{12} = (0100010000)$,
$e_{13} = (1000001000)$, $e_{14} = (0001100000)$, $e_{15} = (0010010000)$,
$e_{16} = (0100001000)$, $e_{17} = (1000000100)$, $e_{18} = (1111000000)$,
$e_{19} = (0001010000)$, $e_{20} = (0010001000)$, $e_{21} = (0100000100)$,
$e_{22} = (1000000010)$, $e_{23} = (1110100000)$, $e_{24} = (0000110000)$,
$e_{25} = (0001001000)$, $e_{26} = (0010000100)$, $e_{27} = (0100000010)$,
$e_{28} = (1000000001)$, $e_{29} = (1101100000)$, $e_{30} = (1110010000)$,
$e_{31} = (0000101000)$, $e_{32} = (0001000100)$

$l_{LRB} = 6$:
$e_1 = (000000)$, $e_2 = (110000)$, $e_3 = (101000)$,
$e_4 = (100100)$, $e_5 = (100010)$, $e_6 = (100001)$,
$e_7 = (011000)$, $e_8 = (010100)$, $e_9 = (010010)$,
$e_{10} = (010001)$, $e_{11} = (001100)$, $e_{12} = (001010)$,
$e_{13} = (001001)$, $e_{14} = (000110)$, $e_{15} = (000101)$,
$e_{16} = (000011)$, $e_{17} = (111100)$, $e_{18} = (111010)$,
$e_{19} = (110110)$, $e_{20} = (101110)$, $e_{21} = (011110)$,
$e_{22} = (111001)$, $e_{23} = (110101)$, $e_{24} = (101101)$,
$e_{25} = (011101)$, $e_{26} = (110011)$, $e_{27} = (101011)$,
$e_{28} = (011011)$, $e_{29} = (100111)$, $e_{30} = (010111)$,
$e_{31} = (001111)$, $e_{32} = (111111)$

FIG.6

SOFT-INPUT SOFT-OUTPUT DECODING OF BLOCK CODES

TECHNICAL FIELD

The present disclosure relates to soft-input soft-output (SISO) decoding of block codes.

BACKGROUND

Modern Forward Error Correction (FEC) in optical communications may use block codes, including Turbo Product Codes, such as in Open FEC (OFEC) for a new generation of optical communications for the International Telecommunication Union (ITU) standard. Complexity and power consumption of decoding algorithms are critical design and operational factors for any application specific integrated circuit (ASIC) decoder that implements the decoding algorithms. Conventional decoders for the block codes suffer from high complexity. For example, a conventional Chase-Pyndiah decoder uses a large number of test vectors to achieve acceptable decoding performance, which translates to high complexity. As a result, implementations of the conventional decoders correspondingly suffer from high power consumption and a large chip area.

BRIEF DESCRIPTION OF THE DRAWINGS

FIG. 6 is a table of even parity error vectors that may be used by the improved Chase-Pyndiah decoder for L=6 least reliable bits (LRBs), according to an example embodiment.

FIG. 7 is a table of even parity error vectors that may be used by the improved Chase-Pyndiah decoder for L=10 LRBs, according to an example embodiment.

DESCRIPTION OF EXAMPLE EMBODIMENTS

Overview

A method is performed by a soft-input soft-output decoder to decode a soft information input vector represented by an input vector that is binary and that is constructed from the soft information input vector. The method includes storing even parity error vectors that are binary and odd parity error vectors that are binary for L least reliable bits (LRBs) of the input vector. The method also includes computing a parity check of the input vector, and selecting as error vectors either the even parity error vectors or the odd parity error vectors based at least in part on the parity check. The method includes hard decoding test vectors, representing respective sums of the input vector and respective ones of the error vectors, based on the L LRBs, to produce codewords that are binary for corresponding ones of the test vectors, and metrics associated with the codewords. The method also includes updating the soft information input vector based on the codewords and the metrics.

Example Embodiments

Embodiments presented herein provide a low-complexity and fast soft-input soft-output (SISO) decoder (also referred to simply as a "decoder") for a broad class of block codes. In an embodiment, the SISO decoder includes an improved Chase-Pyndiah decoder. The decoder may be employed in Forward Error Correction (FEC) decoders for optical and radio communications. The decoder may be used for Turbo Product Codes (TPCs), and for continuously interleaved product codes used for Open FEC (OFEC) employed by the new generation of optical communications for the relevant International Telecommunication Union (ITU) standard.

As described below, the improved Chase-Pyndiah decoder includes modifications/improvements to the conventional Chase-Pyndiah decoder to reduce complexity, while maintaining or increasing performance. For example, the improved Chase-Pyndiah decoder employs a substantially reduced number of test vectors compared to the conventional Chase-Pyndiah decoder, and introduces an enhancement to the conventional Pyndiah algorithm.

Figure 1:
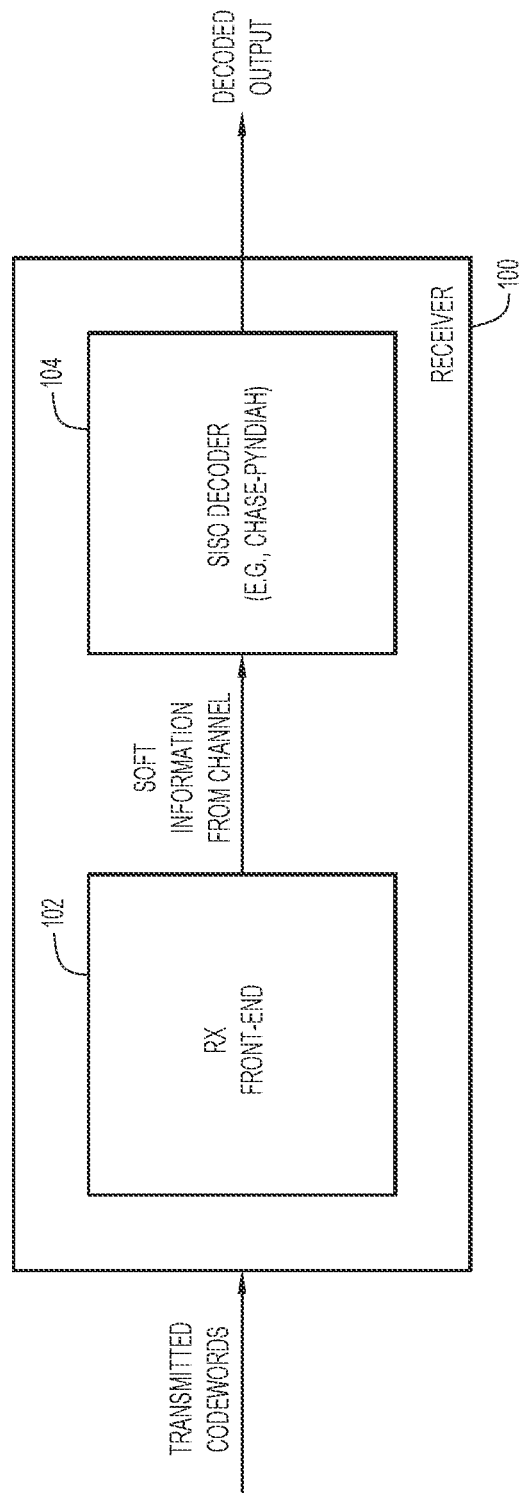
FIG. 1 is a block diagram of a receiver including a soft-input soft-output (SISO) decoder, such as an improved Chase-Pyndiah decoder, according to an example embodiment.

With reference to FIG. 1, there is a block diagram of an example receiver 100 including a receiver (RX) front-end 102 followed by a SISO decoder 104, in which the improved Chase-Pyndiah decoder may be implemented. Receiver front-end 102 may include a network interface unit (NIU), for example. Receiver front-end 102 receives codewords transmitted over a communication channel. The codewords may be constructed based on a block code, such as a Turbo Product code (TPC), although other types of block codes may be used. The received codewords may be corrupted, i.e., they may include bit errors introduced during transmission over the communication channel. Receiver front-end 102 derives soft information representative of the received codewords, and delivers the soft information to SISO decoder 104. SISO decoder 104 decodes the soft information to produce a decoded output, including updated soft information.

Figure 2:
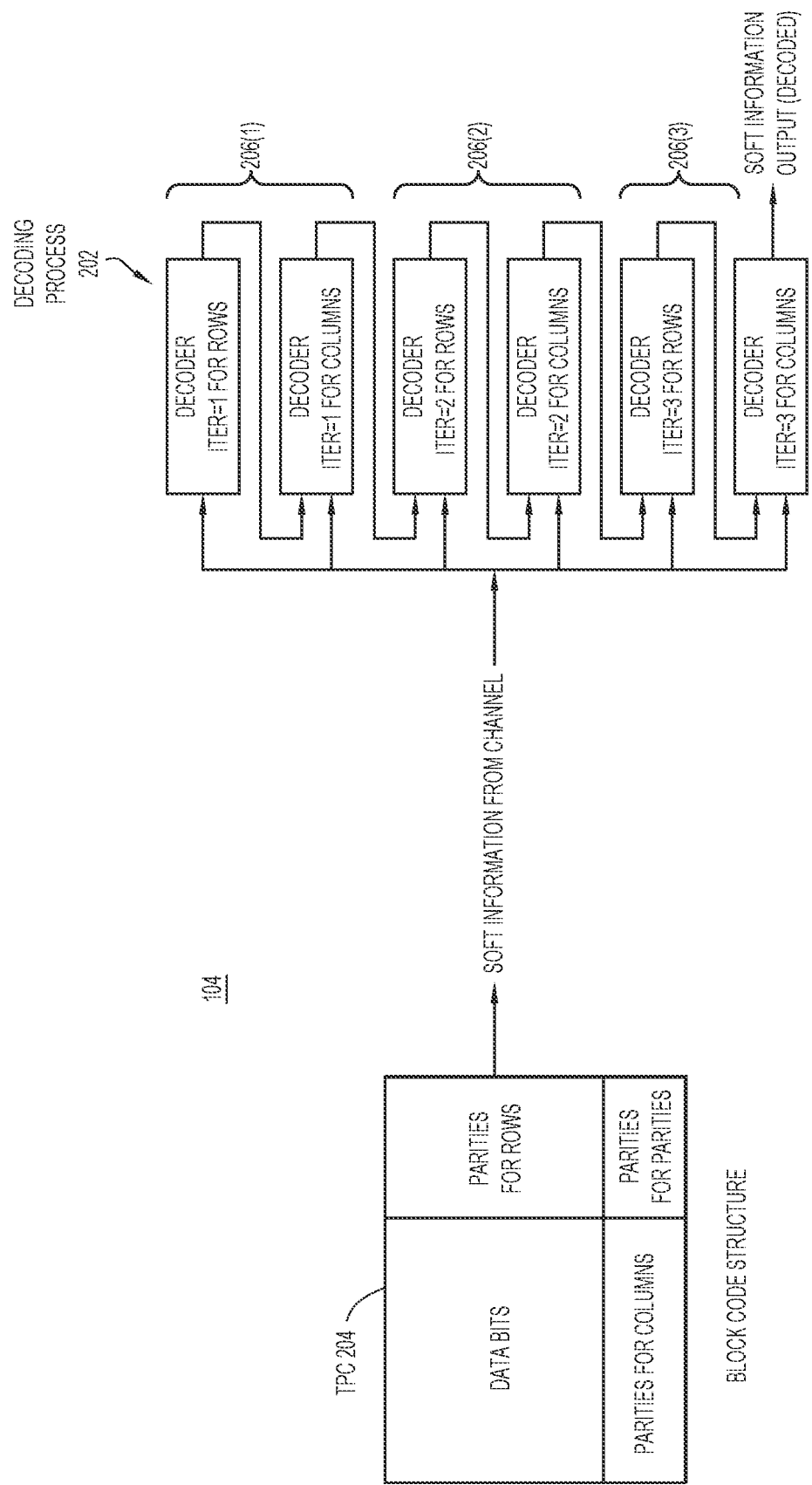
FIG. 2 is an illustration of a high-level decoding process performed on a block code by the SISO decoder, according to an example embodiment.

With reference to FIG. 2, there is an illustration of an example high-level decoding process 202 implemented by SISO decoder 104 to decode codewords of a TPC 204 provided to the decoder. TPC 204 is constructed as a 2-D codeblock having intersecting row and column codewords (also referred to as "vectors"). Each row/column codeword of TPC 204 includes row/column data bits concatenated with row/column parity bits, as shown. Decoding process 202 represents example operations performed by SISO decoder 104. The decoding operations include recursively decoding the row and column codewords of TPC 204. In the example of FIG. 2, decoding process 202 includes three iterative decoding stages 206(1), 206(2), and 206(3) for decoding row and column codewords, although more or less iterations may be used. Each decoding stage 206($i$) receives both soft information derived from previous decoding stage 206($i$−1) and soft information from the channel, to produce respective decoded soft information.

As mentioned above, SISO decoder 104 includes the improved Chase-Pyndiah decoder. Generally, a Chase-Pyndiah decoder (improved or otherwise) includes (i) a Chase decoder, which is a soft information decoder for block codes, and (ii) a soft information update algorithm known as the "Pyndiah algorithm" or the "Pyndiah Update Rule," which updates the soft information based on parameters provided by the Chase decoder. More specifically, the Chase decoder receives the soft information from the communication channel, finds "best" codewords representative of the soft information, and provides the best codewords and their associated metrics to the Pyndiah-Update Rule. Using the parameters provided by the Chase decoder, the Pyndiah Update Rule updates the soft information input to the Chase decoder for a next iteration of decoding to be performed by the Chase decoder, and the cycle repeats over successive iterations.

For purposes of contrast, the ensuing description first presents the conventional Chase-Pyndiah decoder, including the conventional Chase decoder and the conventional Pyndiah Update rule, and then presents the improved Chase-Pyndiah decoder, including an improved Chase decoder and an improved Pyndiah Update rule, in connection with FIGS. 3-13.

The conventional Chase-Pyndiah decoder includes the conventional (or standard) Chase decoder (i.e., the conventional Chase decoder algorithm) to implement soft-input decoding according to the following rules:
  i. Assume a block code of Length N and Log-Likelihood-Ratios (LLRs) $\gamma_i$ (also referred to as "$l_i$" in the literature) of a soft information input vector $x=\{\gamma_0, \gamma_1, \ldots, \gamma_{N-1}\}$ (i.e., the soft information vector input). Moreover, let the binary input vector $h \in \{0, 1\}^N$ denote the hard decision version of x.
  ii. Description of the conventional Chase decoder with n Least Reliable Bits (LRBs):
    a. Find/determine the n LRBs of the binary vector input h by sorting the absolute values of the LLRs of all N bits of soft information input vector $x=\{\gamma_0, \gamma_1, \ldots, \gamma_{N-1}\}$, and select the n positions/bits with the lowest absolute values.
    b. Create a list of $2^n$ error vectors $e_0, e_1, \ldots, e_{2^n-1}$, which form basically all of the combinations of $\{0, 1\}$ at the LRB positions and are zero at the other bit positions of the binary vector h.
    c. Apply a hard decoder to (i.e., hard decode) the binary vectors $t_i = h + e_i$ for $i=0, 1, \ldots, 2^n-1$, i.e., hard decode each of the binary vectors $t_i$, to produce binary codewords $y_i$, with a corresponding flag $f_i \in \{0, 1\}$ per codeword, which indicates whether the binary vector $t_i$ is decodable, e.g., $f_i=0$ or 1 indicates decodable or non-decodable, respectively.
    d. For binary codewords $y_i$, calculate the corresponding metrics $M_i$ as follows:

$M_i = \sum_{j: h_{i,j} \neq y_{i,j}} |\gamma_{i,j}|$ ($j=0,1,\ldots,N-1$ is the bit index in vector).

e. The best one of codewords $y_i$ is the codeword with the lowest corresponding metric.
    f. The outputs from the Chase decoder include codeword tuples of all $M_i$, $y_i$ and $f_i$.

The conventional Chase-Pyndiah decoder uses the conventional Pyndiah Update Rule to update the soft information input x, where $x=[\gamma_1, \ldots, \gamma_N]$, based on the parameters (i.e., the codeword tuples) produced by the Chase decoder. A description of the conventional (or standard) Pyndiah Update rule includes the following:
  i. Input: each of binary codewords $y_i=[y_{i,0}, y_{i,1}, \ldots, y_{i,N-1}]$, metrics $M_i$ (assume that $i=b$ is the "best" codeword with the lowest metric), the soft information input $\gamma_n$ and original soft information from the channel $\gamma_n^{ch}$ for $n=0, 1, \ldots, N-1$.
  ii. Apply the conventional Update rule for the nth bit of x:

$\gamma_n = \gamma_n^{ch} + \alpha((M_b - M_c) * (2*y_{n,b}-1) - \gamma_n)$ if there is a competitor code word c with lowest metric which fulfills $y_{n,b} \neq y_{n,c}$.

$\gamma_n = \gamma_n^{ch} + \beta*(2*y_{n,b}-1)$ if there is no competitor code word c which fulfills $y_{n,b} \neq y_{n,c}$, where $\gamma_n^{ch}$ denotes the soft information that is calculated first and only once based on the received signal, and $\gamma_n$ is the soft information calculated in each iteration performed by the decoder. Thus, $\gamma_n$ may include an iteration index to indicate the iteration, but the iteration index is omitted here for simplicity.
  iii. Constants $\alpha$ and $\beta$ are fixed per iteration having suggested values:

$\alpha$(iter)=[0.2,0.3,0.5,0.7,0.9,1.0,1.0].

$\beta$(iter)=[0.2,0.4,0.6,0.8,1.0,1.0,1.0].

Having described the conventional Chase-Pyndiah decoder, the improved Chase-Pyndiah decoder is now described.

Figure 3:
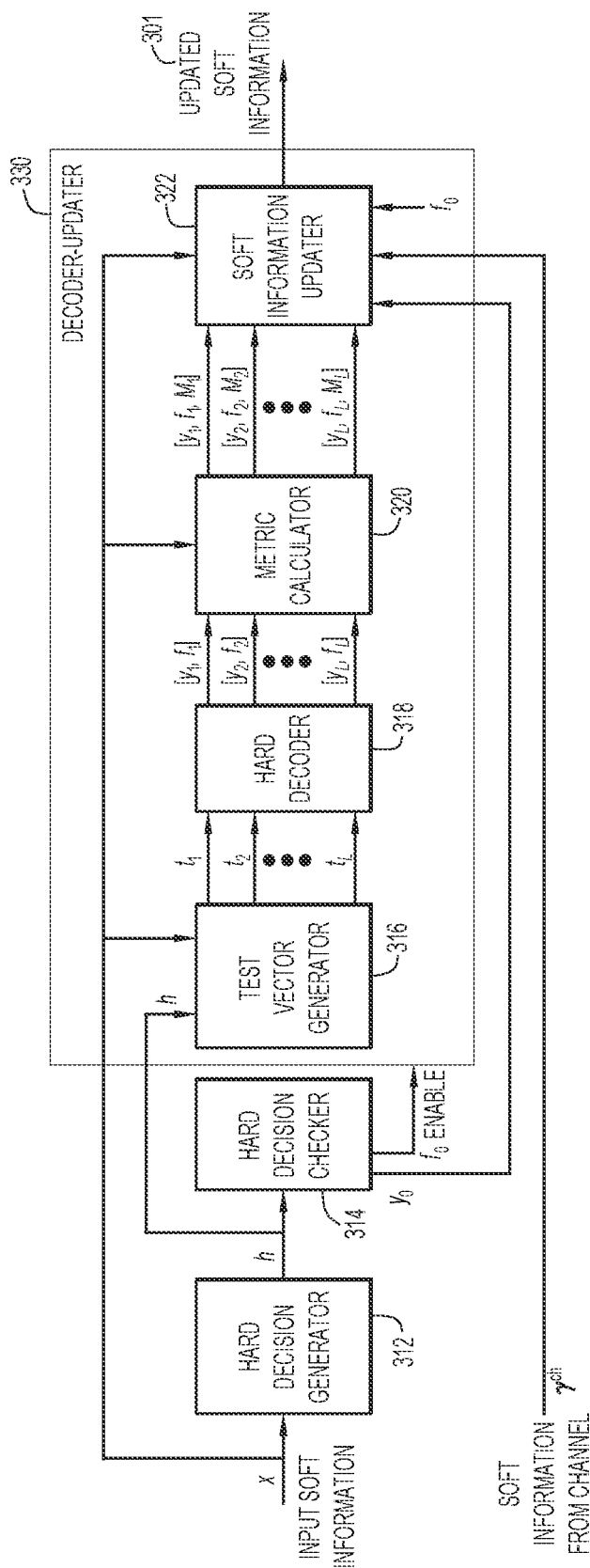
FIG. 3 is a block diagram of the improved Chase-Pyndiah decoder, according to an example embodiment.

With reference to FIG. 3, there is a block diagram of an improved Chase-Pyndiah decoder 300 corresponding to SISO decoder 104, according to an embodiment. Improved Chase-Pyndiah decoder 300 (also referred to simply as "Chase-Pyndiah decoder 300") includes an improved Chase decoder that implements improvements over the conventional Chase decoder, and an improved Pyndiah Update rule that implements improvements to the conventional Pyndiah Update rule. At a high level, the improved Chase decoder receives soft information input vector x and original soft information $\gamma^{ch}$ from the channel, and decodes the soft information input vector x. Then, the improved Pyndiah Update rule updates the soft information input vector x based on information provided by the improved Chase decoder and the original soft information $\gamma^{ch}$ from the channel, to produce updated soft information 301. The aforementioned "decode→soft information update" cycle repeats over successive iterations. Chase-Pyndiah decoder 300 outperforms the conventional Chase-Pyndiah decoder using the following improvements:
  i. The improved Chase decoder optimizes test vectors used for decoding relative to those used in the conventional Chase decoder, which improves decoding performance.

ii. The improved Chase decoder utilizes even parity to reduce the number of test vectors by half, which correspondingly reduces decoder complexity significantly.

iii. The improved Pyndiah Update rule introduces a new normalization factor, to improve the performance of soft information updates.

A non-iterative soft-input hard-output decoder for linear block codes may also employ the first two improvements listed above.

Chase-Pyndiah decoder 300 includes the following signal processing modules or blocks connected in series: a hard decision generator 312; a hard decision checker 314; a test vector generator 316; a hard decoder 318; a metric calculator 320; and a soft information updater 322. Test vector generator 316, hard decoder 318, metric calculator 320, and soft information updater 322 collectively represent a decoder-updater 330 of Chase-Pyndiah decoder 300. Test vector generator 316 primarily implements improvements to the Chase decoder, while soft information updater 322 primarily implements improvements to the Pyndiah Update rule. By way of example, the following description assumes the following:

i. Chase-Pyndiah decoder 300 decodes a binary linear block code with total length N bits and input data length K bits.

ii. The block code includes even parity (e.g., in extended Bose-Chaudhuri-Hocquengem (eBCH) (256,239) in OFEC). The extra parity plays a role in the decoding and error detection capability of the block code, and is used to determine whether the number of bit errors is even or odd.

iii. A hard decoding operation decodes a binary input vector to a decoded binary output vector ($a_D$) and a flag (f), which indicates if the input vector is decodable. f=0 indicates that the decoding fails and f=1 indicates that the input vector is decoded to a codeword.

In operation, first, hard decision generator 312 receives soft information input vector x and converts it to binary input vector h. That is, hard decision generator 312 constructs binary input vector h from soft information input vector x, according to the following rule $$h_i = \begin{cases} 0 & x_i < 0 \\ 1 & x_i \geq 0 \end{cases}.$$

Hard decision checker 314 performs an initial hard decode of binary input vector h to a binary codeword $y_0$ and an associated metric, and generates a flag $f_0$ based on the metric and that indicates to decoder-updater 330 whether the result of the initial hard decode is sufficient (e.g., binary codeword $y_0$ is "good enough," flag $f_0=1$) or is insufficient (e.g., binary codeword $y_0$ is not good enough, flag $f_0=0$). When flag $f_0$ indicates that the initial hard decode is sufficient, test vector generator 316, hard decoder 318, and metric calculator 320 of decoder-updater 330 are essentially skipped or disabled, in which case soft information updater 322 updates soft information input x based on binary code word $y_0$ and its associated metric.

On the other hand, when flag $f_0$ indicates that the initial hard decode is insufficient, test vector generator 316, hard decoder 318, and metric calculator 320 are enabled to perform subsequent decoding operations on binary input vector h, to produce codeword tuples of the form [codeword $y_i$, flag $f_i$, metric $M_i$] for binary input vector h, as described further below. Then, soft information updater 322 updates soft information input x based on codeword tuples [$y_i$, $f_i$, $M_i$] using the improved Pyndiah Update rule.

The ensuing description of decoder-updater 330 assumes that flag $f_0$ indicates that further decoding of binary input vector h is to be performed. First, test vector generator 316 receives binary input vector h. Test vector generator 316 generates a number of binary test vectors $t_i$ based on binary input vector h and binary error vectors (not shown) generated by the test vector generator in accordance with the embodiments presented herein. The number of test vectors $t_i$ is much less than a number of test vectors that would otherwise be generated by the conventional Chase decoder. The reduced number of test vectors relative to the conventional Chase decoder results in reduced complexity and computational burden of the improved Chase decoder relative to the conventional Chase decoder.

Test vector generator 316 provides binary test vectors $t_i$ to hard decoder 318. Hard decoder 318 decodes binary test vectors $t_i$, to produce corresponding binary codewords $y_i$, flags f that indicate whether the test vectors t are decodable, and metrics $M_i$ associated with corresponding ones of the binary codewords and that indicate how reliable the codewords are. Hard decoder 318 provides codeword tuples [codeword $y_i$, flag $f_i$, metric $M_i$] to soft information updater 322. Soft information updater 322 employs the updated Pyndiah Update rule to update the soft information of soft information input vector x based on codeword tuples [$y_i$, $f_i$, $M_i$] and original soft information $\gamma_n^{ch}$ from the channel, to produce updated soft information 301.

Figure 4:
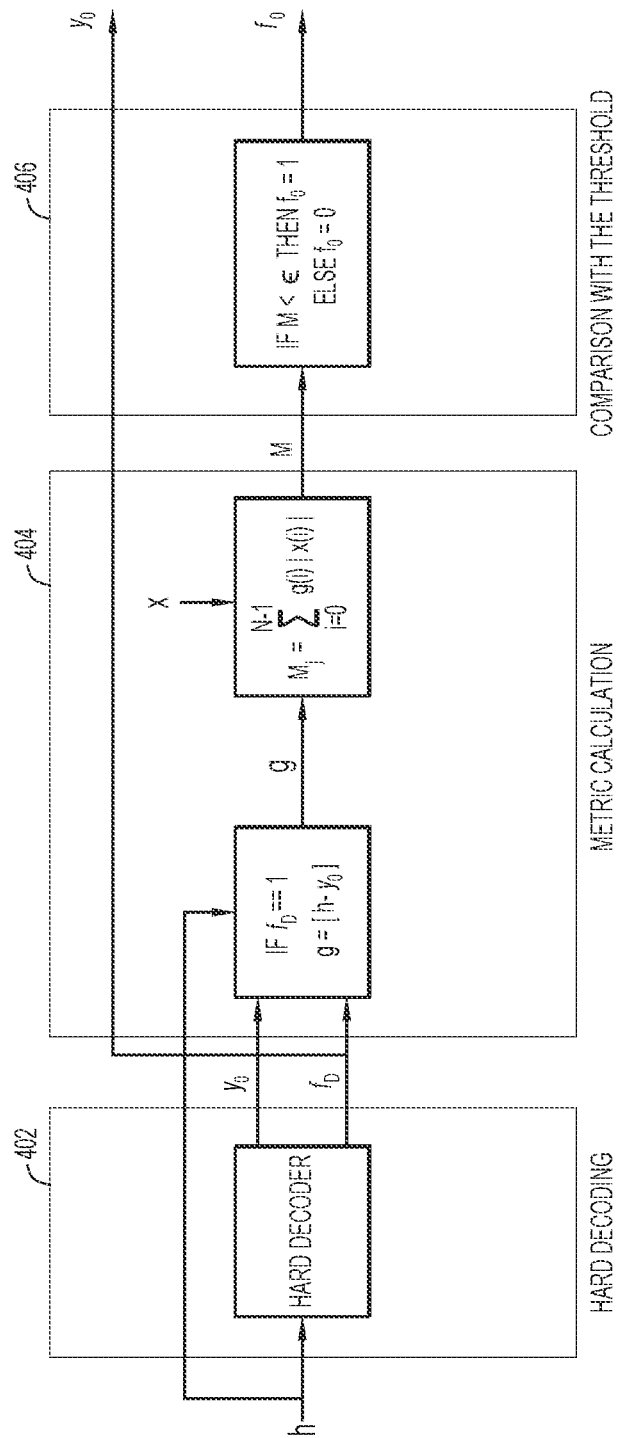
FIG. 4 shows operations performed by a hard decision checker of the improved Chase-Pyndiah decoder, according to an example embodiment.

With reference to FIG. 4, there are shown example operations performed by hard decision checker 314. A hard decoding operation 402 hard decodes binary input vector h, to produce binary codeword $y_0$ and a flag $f_D$ that indicates whether binary input vector h is decodable (e.g., $f_D=1$). A metric calculation operation 404 first determines whether flag $f_D=1$. If flag $f_D=1$, metric calculation operation 404 computes a bitwise Exclusive-OR (XOR) operation between h and $y_0$ to produce a result g or, alternatively, an absolute difference, represented by g, between binary input vector h and corresponding codeword $y_0$, e.g., g=|h−$y_0$|. Metric calculation operation 404 also computes a metric M associated with codeword $y_0$. Metric M is a summation of N individual products of g and respective ones of soft information bits $x_i$-$x_N$ of soft information input vector x, i.e., M is a sum of the absolute values of LLRs at corrected positions of $x_i$. A comparison operation 406 determines whether metric M<predetermined threshold $\epsilon$, and sets flag $f_0$ based on results of the determination. For example, if metric M<$\epsilon$ then $f_0=1$, else $f_0=0$.

Figure 5:
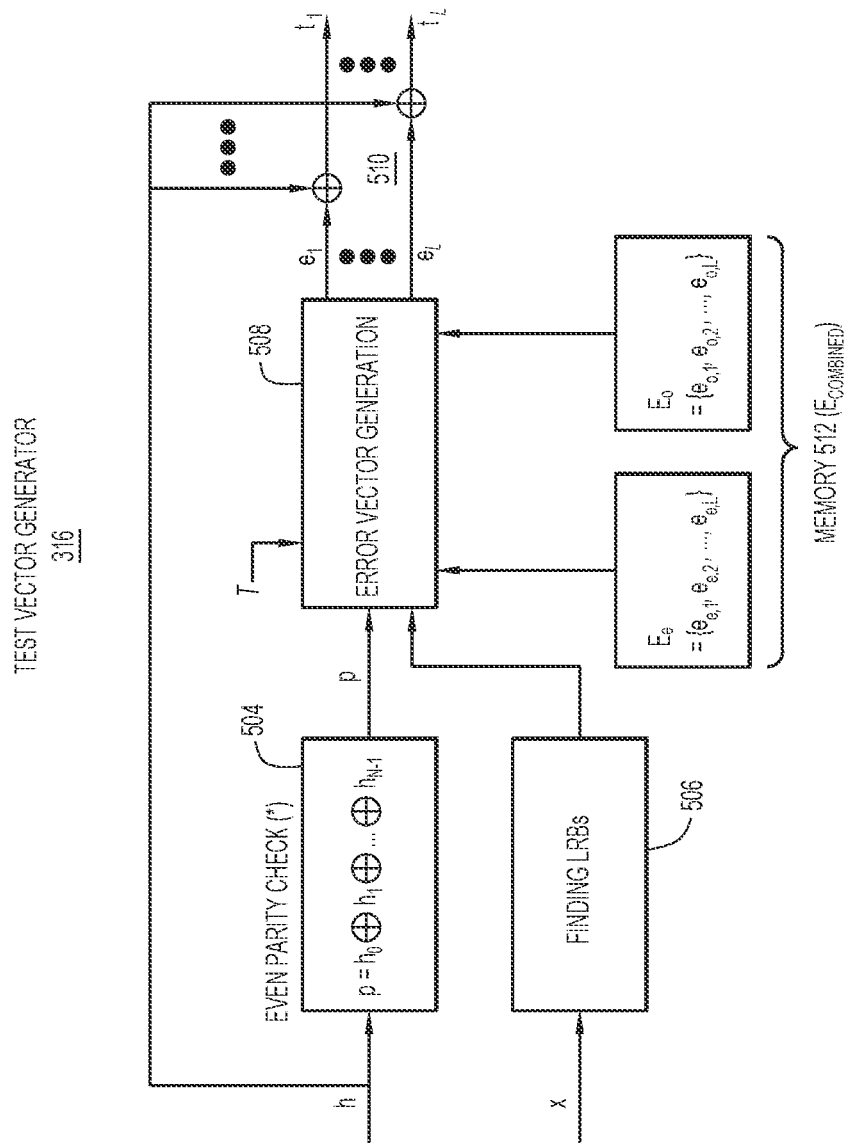
FIG. 5 is a block diagram that shows operations performed by a test vector generator of the improved Chase-Pyndiah decoder, according to an example embodiment.

With reference to FIG. 5, there is block diagram that shows example operations of test vector generator 316. Test vector generator 316 includes a parity checker 504, an LRB determiner 506, an error vector generator 508, adders 510, and a memory 512 to store predetermined binary error vectors $E_{combined}$ subdivided into two groups, including (i) a first group of $\leq 2^L/2$ even parity error vectors $E_e$ that each have L bits and even parity, i.e., an even number of binary 1s, and (ii) a second group of $\leq 2^L/2$ odd parity error vectors $E_0$ that each have L bits and odd parity, i.e., an odd number of binary 1s. Each of even parity error vectors $E_e$ and each of odd parity error vectors E is a binary vector.

Parity checker 504 performs a parity check p on binary input vector h. In an example, parity check p may be an even parity check, which may result from a bitwise exclusive-OR (XOR $\oplus$) across all N bits of binary input vector h, e.g., parity check $p=h_0 \oplus h_1 \oplus \ldots \oplus h_{N-1}$. This assumes an additional parity check redundancy bit across all coded bits, e.g., by BCH extension.

LRB determiner 506 determines/finds L LRBs, and their bit positions, among the bits of binary input vector h based on the soft information "bits" of soft information vector x.

Assume the codewords are associated with a block code having a known correction capability T, i.e., the block code can correct up to T bit errors per transmitted codeword, and that correction capability T is accessible to error vector generator 508, i.e., the error vector generator receives T as an input. Then, error vector generator 508 selects as error vectors E for use in generating test vectors $t_i$ either the group of even parity error vectors $E_e$ or the group of odd parity error vectors $E_o$ based on parity check p and correction capability T (also referred to as "T bit error correction capability"), according to predetermined selection rules. Table 1 below provides an example of the selection rules used to select either odd parity error vectors $E_o$ or even parity error vectors $E_e$ as the error vectors E, based on p and T.

TABLE 1

Error Vector Selection

|  | p = 0 | p = 1 |
|---|---|---|
| T: even | E = $E_e$ | E = $E_o$ |
| T: odd | E = $E_o$ | E = $E_e$ |

Adders 510 bitwise add/sum (e.g., bitwise XOR) binary input vector h with individual ones of selected error vectors E, to produce corresponding ones of test vectors $t_i$. In FIG. 5, a single test vector t of width L is shown exiting adders 510 in FIG. 5.

As mentioned above, the conventional Chase decoder uses $2^L$ error vectors (where L is the number of LRBs) to generate $2^L$ corresponding test vectors, which are then processed in subsequent decoding operation. In contrast, to reduce the number of test vectors and thus decoding complexity, Chase-Pyndiah decoder 300 uses parity check p to select $\leq 2^L/2$ error vectors, to generate $2^L/2$ test vectors. Thus, Chase-Pyndiah decoder 300 reduces the number of error vectors and the number of test vectors by at least half compared to the conventional Chase decoder. Moreover, the reduction in complexity is achieved without a loss in decoding performance.

As mentioned above, selecting between even and odd parity error vectors based at least in part on check parity p, and then using only the selected error vectors to decode binary input vector h, achieves at least the same decoding performance as not selecting between the even and odd parity error vectors. An illustration of this is provided by the following example, which makes the following assumptions:

i. Use of a block code with T=1 correction capability.
  ii. There are two bit errors at bit positions 3 and 43 of received codewords, where position 43 is among L=6 LRBs (i.e. is at a least-reliable position corresponding to a least reliable bit).
  iii. Chase-Pyndiah decoder 300 computes even parity check p=0, which indicates an even number of bit errors in binary input vector h.
  iv. Error vectors with weights up to 6 LRBs are used, where a weight of an error vector=the sum of 1 bits in the error vector.

Using all $2^6=64$ error vectors with even and odd weights (i.e., using all even and odd parity error vectors), the conventional Chase decoder corrects the bit error at position 43 based on the error vector with weight 1 at position 43, and corrects the bit error at position 3 by hard decoding the test vector.

Consider using only error vectors with even weights (i.e., even parity error vectors) to correct the bit errors. In this case, none of the $2^6/2=32$ error vectors with even weights can correct the error. Also, consider using only error vectors with odd weights (i.e., using the odd parity error vectors). In this case, although only half of the error vectors are tested (i.e., only the $2^6/2=32$ error vectors with odd weights are tested), the bit error can be corrected because the desired error vector with weight 1 is among the considered error vectors. Thus, use of parity check p in Chase-Pyndiah decoder 300, to down-select to the appropriate even or odd parity error vectors for use in generating a reduced number of test vectors, results in the same decoding performance as use of all the even and odd parity error vectors in the conventional Chase decoder.

In a first example, Chase-Pyndiah decoder 300 stores/uses $2^L/2$ different even parity error vectors and $2^L/2$ different odd parity error vectors. In a second example, Chase-Pyndiah decoder 300 stores/uses $<2^L/2$ different even parity error vectors and $<2^L/2$ different odd parity error vectors. The number of even parity error vectors and the number of odd parity error vectors may be the same, or may be different. For the second example, an offline error vector down-selection process, i.e., an a priori error vector down-selection process, may be employed to (i) preselect a first subset (of $<2^L/2$) even parity error vectors from a set of $2^L/2$ different even parity error vectors, and (ii) preselect a second subset (of $<2^L/2$) odd parity error vectors from a set of $2^L/2$ different odd parity error vectors based on a bit error correction performance criterion, e.g., such that the odd/even parity error vectors in the first/second subset provide improved bit error correction performance compared to ones of the $2^L/2$ odd/even parity error vectors that are not in the odd/even subset. The first subset of even parity error vectors and the second subset of odd parity error vectors are then stored as error vectors $E_{combined}$, for use in the real-time decoding operations, as described above.

The offline error-vector down-selection process may include (i) running post-FEC bit error rate (BER) tests corresponding to use of each of the $2^L/2$ even/odd error vectors to correct bit errors in received codewords during the decoding process, to determine the effectiveness of each of the error vectors (i.e., lower BER corresponds to more effective, and vice versa), (ii) sorting the error vectors based on their BER/effectiveness, and (iii) selecting from the $2^L/2$ even/odd error vectors a subset of the error vectors that are most effective. One technique for running the post-FEC BER tests may include using a Monte Carlo simulation to generate received codewords with random bit errors, and decoding the received codewords using the different error vectors, one at a time, to collect the BERs, for example.

With reference to FIG. 6, there is shown a table 600 of $2^L/2$ even parity error vectors (parity check p=0) that may be used by Chase-Pyndiah decoder 300 for a case in which L (also denoted $l_{LRB}$)=6. The error vectors are shown only in the LRBs. In an example, the error vectors may be used with eBCH (256,239,T=2). A similarly sized table/set of odd parity error vectors may be used by Chase-Pyndiah decoder 300 in this case. Table 600 includes $2^6=32$ even parity error vectors, i.e., a full complement of all available even parity error vectors.

With reference to FIG. 7, there is shown a table 700 of $<2^L/2$ even parity error vectors that may be used by Chase-Pyndiah decoder 300 (e.g., for eBCH (256,239,T=2)) for a case in which L=10. The even parity error vectors are shown only in the LRBs. A similarly sized table/set of odd parity error vectors may be used by Chase-Pyndiah decoder 300 in this case. While the number of all available even parity error vectors=$2^{10}/2$ (=512) for L=10, table 600 only includes $2^6$=32 (i.e., $<2^L/2$) even parity error vectors. The 32 even parity error vectors were preselected from all available 512 even parity error vectors using the offline error vector down-selection process, and then stored in the decoder, as described above. SISO decoding based on those 32 out of 512 preselected error vectors outperforms the L=6 case, where all $2^L/2$=32 test vectors are used.

Figure 8:
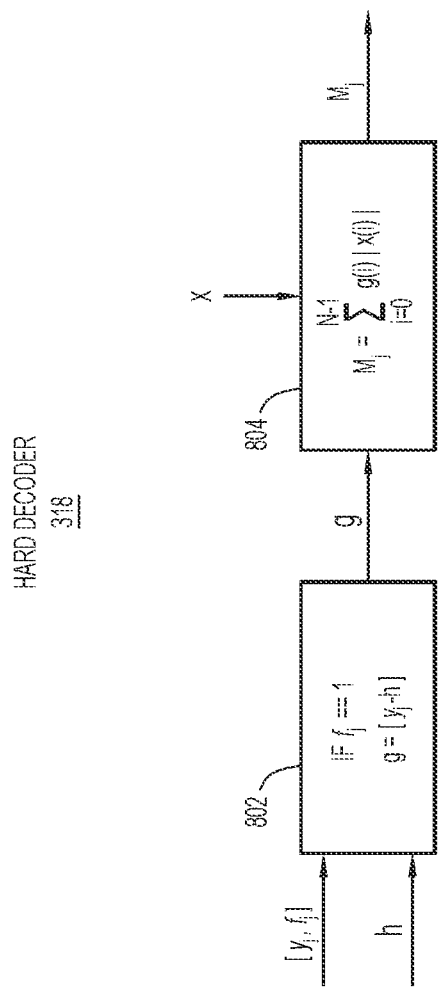
FIG. 8 shows operations performed by a hard decoder of the improved Chase-Pyndiah decoder, according to an example embodiment.

With reference to FIG. 8, there is shown a sequence of example operations performed by hard decoder 318. Hard decoder 318 includes L individual hard decoder blocks. The operations show hard decoding of a jth decoded test vector, represented as codeword tuple [$y_j$, $f_j$]. An operation 802 evaluates $f_j$ and, if $f_j$=1, computes g as a bitwise XOR between h and $y_j$ or, alternatively, as g=|h−$y_j$|. An operation 804 computes metric $M_j$ according to the following:

$$M_j = \sum_{i=0}^{N-1} g(i)|x(i)|.$$

Figure 9:
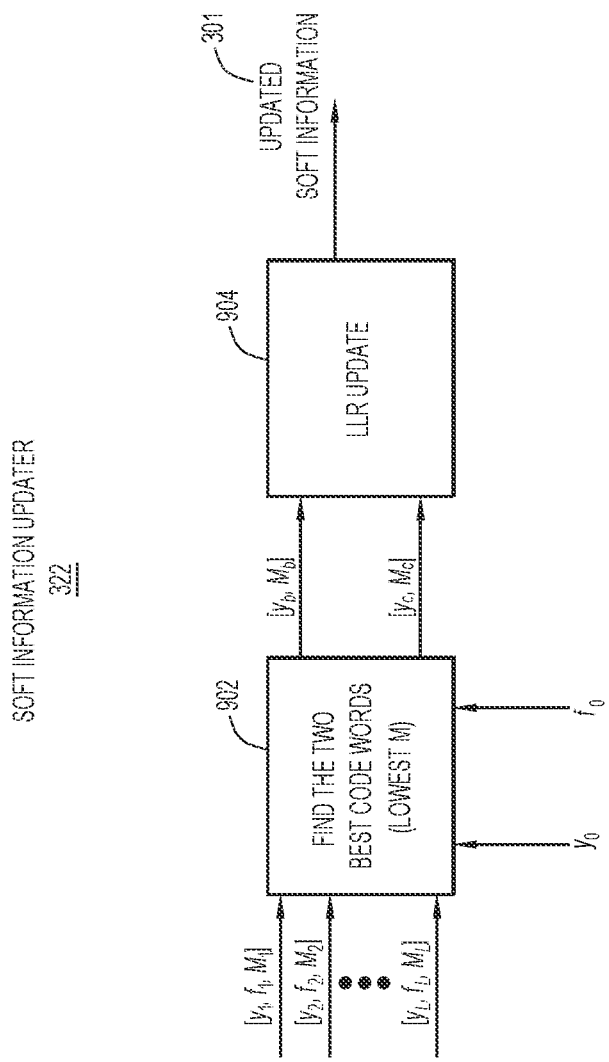
FIG. 9 shows operations performed by a soft information updater of the improved Chase-Pyndiah decoder, according to an example embodiment.

With reference to FIG. 9, there are shown example operations performed by soft information updater 322. An operation 902 receives codeword tuples [$y_i$, $f_i$, $M_i$], initial codeword $y_0$ and its associated flag $f_0$. Based on these inputs, operation 902 finds a best code $y_b$ word (i.e., a most reliable/likely codeword) among the codewords with a lowest metric $M_b$ (denoted by index b) and, if available, a second best codeword $y_c$ (i.e., a second most reliable/likely codeword) with the a second lowest metric $M_b$ (denoted by index c), to produce best codeword tuples [$y_b$, $M_b$] and [$y_c$, $M_c$]. In an example, $M_b$ is a non-negative number, such as an integer, which depends on how many bits are assigned to each of the metrics M. Also, operation 902 evaluates $f_0$ and, if $f_0$=1, it is assumed that $y_0$ is the best codeword and there is no competitor. Operation 902 provides the aforementioned results to operation 904, referred to as "LLR update."

LLR update uses the improved Pyndiah Update rule to update the soft information bits of soft information input x (where x=[$\gamma_1, \ldots, \gamma_N$]), based on the results from operation 902, to produce updated soft information 301. The improved Pyndiah Update rule only considers the best codeword with the lowest metric (with index b) and, when available, the second best codeword (with index c). Also, repetition may be avoided when some of the decoded vectors are the same.

The improved Pyndiah Update rule for updating the nth bit $\gamma_n$ of soft information input vector x, where x=[$\gamma_1, \ldots, \gamma_N$], includes the following operations:
  i. Set a normalization factor $\zeta$=max(0, $c_1-c_2*M_b$), where $c_1$ and $c_2$ are two constants, which depend on a particular implementation, and hence are optimized for that implementation (e.g., for eBCH(256,239): $c_1 \approx 2.4$, $c_2 \approx 1.0$).
  ii. Set $\gamma_n = \gamma_n^{ch} + \alpha*\zeta*((M_b-M_c)*(2*y_{n,b}-1)-\gamma_n)$ if $y_{n,b} \neq y_{n,c}$.
  iii. Set $\gamma_n = \gamma_n^{ch} + \beta*\zeta*(2*y_{n,b}-1)$ if $y_{n,b}=y_{n,c}$.

Constants $\alpha$ and $\beta$ are fixed per iteration and are optimized using a Monte-Carlo simulation, for example. $\gamma_n^{ch}$ is the original soft information from the channel. Also, $y_{n,b}$ or $y_{n,c}$ represents an nth bit of the best or second codeword.

The improved Pyndiah Update rule introduces the new normalization factor $\zeta$ that is not used in the conventional Pyndiah Update rule. Normalization factor $\zeta$ effectively reduces the contribution/effect of coefficients $\alpha$ and $\beta$ to $\gamma_n$ relative to $\gamma_n^{ch}$ when lowest metric $M_b$ is very large (where a low metric is desired), which indicates that the reliability of the corresponding codeword is low. On the other hand, when lowest metric $M_b$ is low (which means high reliability), normalization factor $\zeta$ ensures a larger contribution from coefficients $\alpha$ and $\beta$. The "max" operation used in computing normalization factor $\zeta$ ensures that (does not become negative. Use of normalization factor provides a significant performance improvement compared to when the normalized factor is not used.

Figure 10:
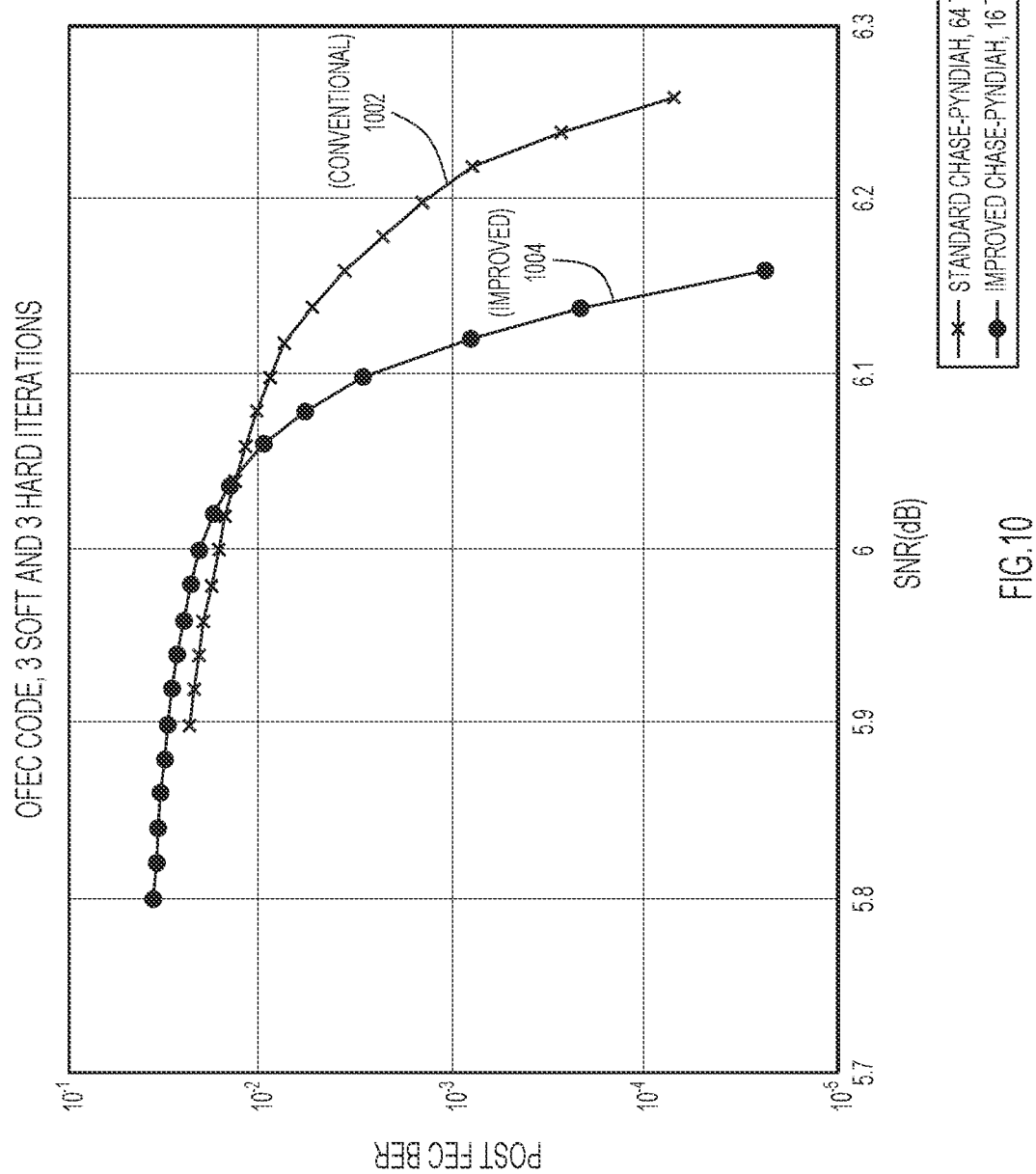
FIG. 10 shows comparison bit error rate (BER) performance curves for the improved Chase-Pyndiah decoder and a conventional Chase-Pyndiah decoder, according to an example embodiment.

With reference to FIG. 10, there is a performance curve 1002 (of post FEC BER vs. Signal to Noise Ratio (SNR)) for the conventional Chase-Pyndiah decoder, and a performance curve 1004 (of post FEC BER vs. SNR) for Chase-Pyndiah decoder 300 (i.e., for the improved Chase-Pyndiah decoder). The reduced complexity Chase-Pyndiah decoder 300 outperforms the conventional Chase-Pyndiah decoder. For example, Chase-Pyndiah decoder 300, using only 16 test vectors (from 16 error vectors), outperforms the conventional Chase-Pyndiah decoder using 64 test vectors (from 64 error vectors).

Figure 11:
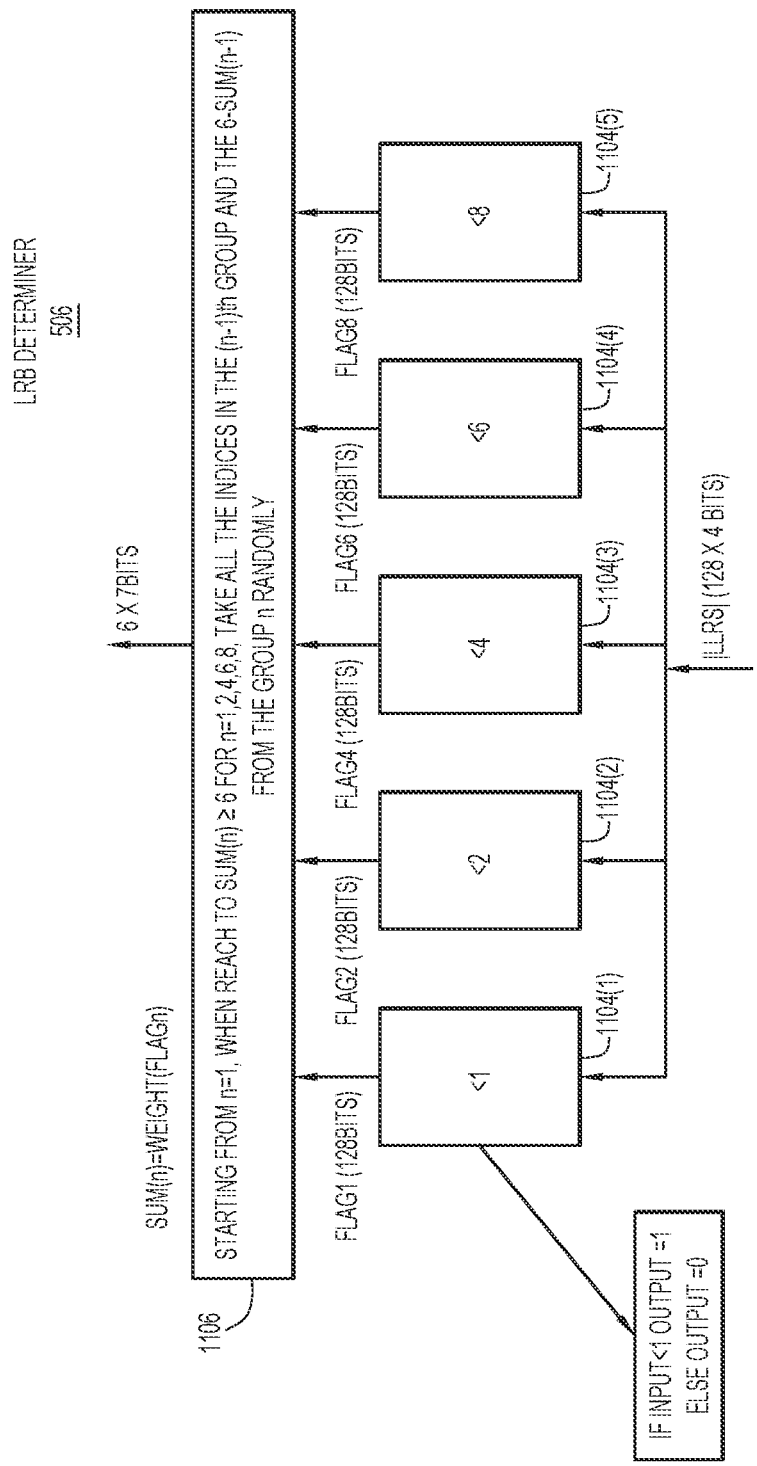
FIG. 11 shows operations performed by an LRB determiner of the test vector generator, according to an example embodiment.

With reference to FIG. 11, there are shown example operations performed by LRB determiner 506 for a code of length 128. The operations include a set of threshold operations 1104(1)-1104(5) having respective outputs Flag1-Flag8 that feed a summing operation 1106. Threshold operations 1104(1)-1104(5) operate concurrently. Threshold operations 1104(1)-1104(5) receive LLRs of soft-information input vector x (e.g., $y_i$), and determine whether the LLRs are less than respective increasing fixed thresholds 1-8 applied by the threshold operations, to produce respective ones of flags Flag1-Flag8 that indicate results of the determination. For example, for threshold operation 1104(1), if the LLR input (magnitude)<1, then output Flag1=1, otherwise Flag1=0. Summing operation 1106 receives the respective flags provided by threshold operations 1104(1)-1104(5), and applies a summing operation across the flags. For example, assuming indexes 1, 2, 3, and so on, are assigned to the threshold operations 1104(1), 1104(2), 1104(3), and so on, then sum(n) is the sum of all flag bits from threshold operation 1104(1) to 1104(n). For example if there are 6 flag=1 in the first threshold operation, then sum(1)=6, and 6 is selected in the example.

As mentioned above, LRB determiner 506 finds LRBs by comparing all of the LLRs with fixed thresholds. This approach is more effective than comparing the LLRs with each other, especially in the case of low resolution LLRs. For example: consider a Hamming criterion eHamming(128, T=1) and low resolution 4-bit LLRs. In this case, all the 128 values (i.e., the absolute value of LLRs) can be compared against a large set of thresholds $\{1, 2, 3, 4, \ldots, 15\}$, after which LRBs may be found by taking LLRs from the first group. It has been observed that since LRBs are those positions with small absolute values of LLRs, it is not necessary to compare the LLRs with all 15 thresholds, as only a few of the thresholds are sufficient. In the example, it has been observed that comparing the LLRs against fewer thresholds, e.g., thresholds $\{1, 2, 4, 6, 8\}$ as shown in FIG. 11, results in similar performance as comparing the LLRs against the larger number of thresholds, e.g., thresholds $\{1, 2, 3, 4, \ldots, 15\}$. Another advantage of LRB determiner 506 is that an increase in the number of LRBs has a limited impact on computational complexity because the increase only impacts summing operation 1106.

Figure 12:
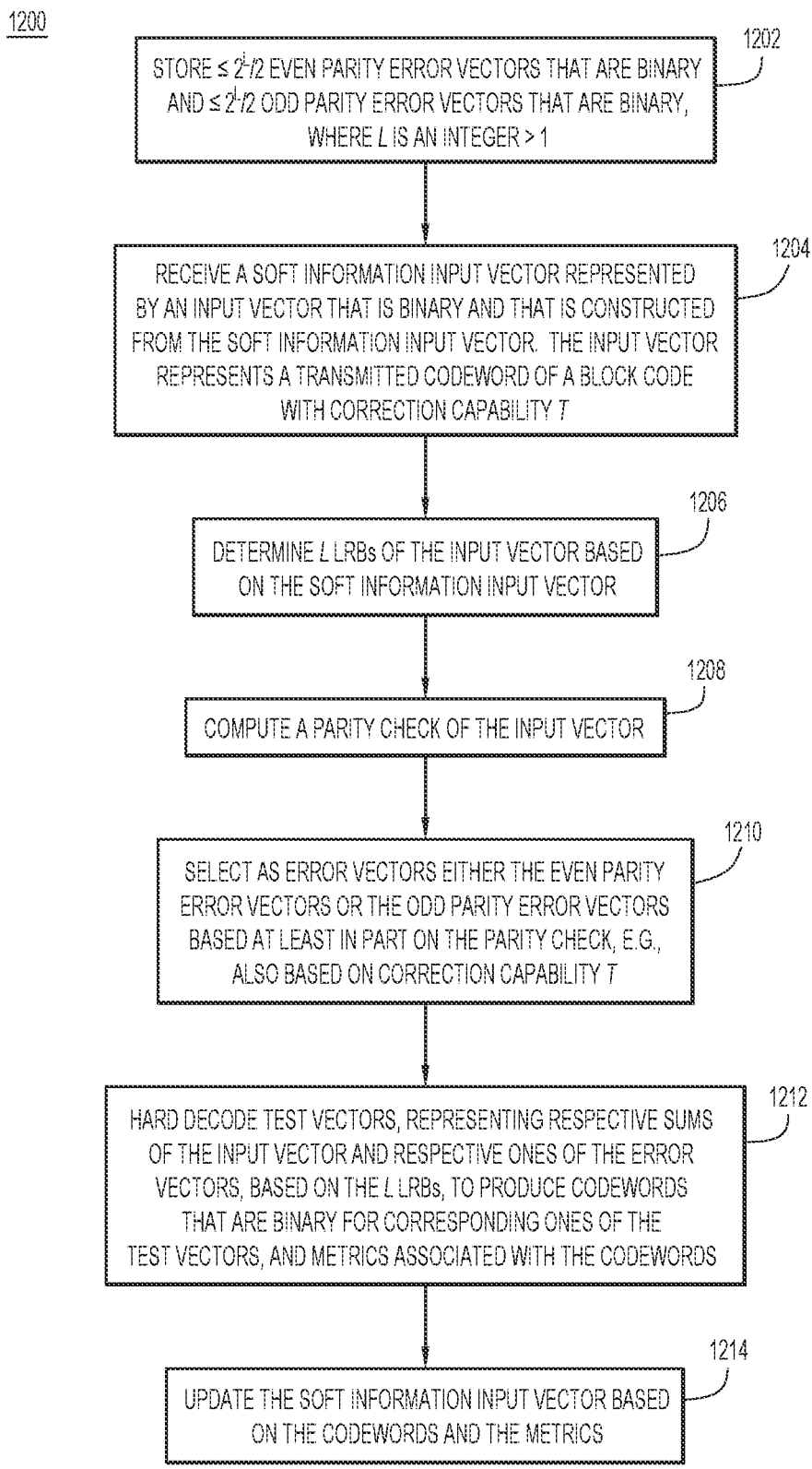
FIG. 12 is a flowchart of a method of decoding performed by the improved Chase-Pyndiah decoder, according to an example embodiment.

With reference to FIG. 12, there is a flowchart of an example method 1200 performed by a SISO decoder according to embodiments presented herein, e.g., by Chase-Pyndiah decoder 300.

At 1202, the decoder stores $\leq 2^L/2$ even parity error vectors $E_e$ that are binary and $\leq 2^L/2$ odd parity error vectors $E_o$ that are binary, where L is an integer >1, e.g., 6, 10, and so on. Operation 1202 may be performed a priori, e.g., during a configuration of the decoder, before all of the other real-time operations of method 1200 (described next) are performed, so that the other operations have access to the even and odd parity error vectors.

At 1204, the decoder receives a soft information input vector x represented by an input vector h that is binary and that is constructed from the soft information input vector x. The input vector x represents a transmitted codeword of a block code with correction capability T.

At 1206, the decoder determines L LRBs of the input vector h based on the soft information input vector x.

At 1208, the decoder computes a parity check p on the input vector h, which may be an even parity check.

At 1210, the decoder selects as error vectors E either the even parity error vectors $E_e$ or the odd parity error vectors $E_o$ based at least in part on the parity check p. The selection may also be based on correction capability T.

At 1212, the decoder hard decodes test vectors t, representing respective sums (e.g., bitwise XOR) of the input vector h and respective ones of the error vectors E, based on the L LRBs, to produce codewords y that are binary for corresponding ones of the test vectors t, and metrics M associated with the codewords.

At 1214, the decoder updates the soft information input vector x based on the codewords y and the metrics M. For example, the updating may be performed using the improved Pyndiah Update rule described above or, alternatively, using the conventional Pyndiah Update rule. The decoding operations repeat, except for the storing operation 1204.

Figure 13:
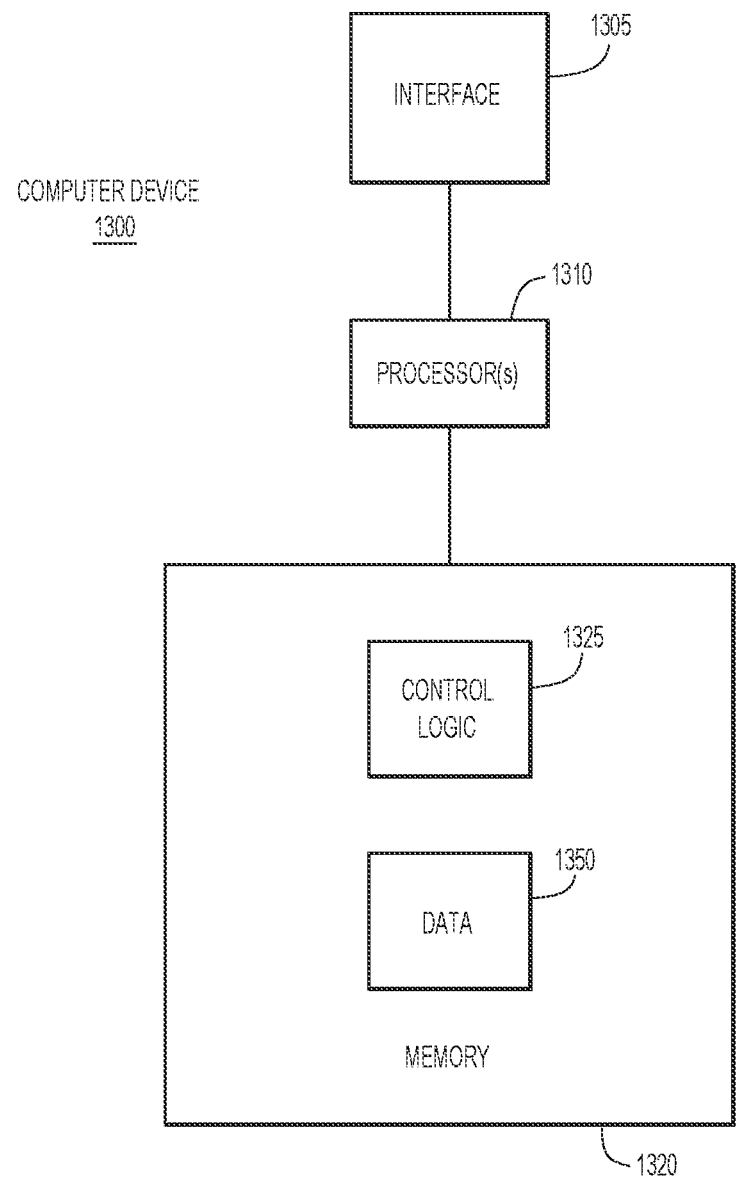
FIG. 13 is a hardware block diagram of a computer device in which the improved Chase-Pyndiah decoder may be implemented, according to an example embodiment.

With reference to FIG. 13, there is depicted a hardware block diagram of an example computer device 1300 in which improved Chase-Pyndiah decoder 300 may be implemented. Computer device 1300 includes an interface 1305 to receive a signal transmitted over a channel and that conveys transmitted codewords of a block code, and to convert the received codewords to soft information representative of the codewords. Interface 1305 may include a network interface unit (NIU) with an Ethernet card and a port (or multiple such devices) to communicate over wired Ethernet links and/or a wireless communication card with a wireless transceiver to communicate over wireless links. Interface 1305 may convert a received, modulated, radio frequency (RF) signal to a digitized demodulated baseband signal that conveys the codewords, for example.

Computer device 1300 includes one or more processors 1310 that execute software stored in memory 1320. Processor(s) 1310 include, for example, one or more microprocessors and/or microcontrollers. To this end, the memory 1320 stores instructions for software stored in the memory that are executed by processor(s) 1310 to perform the methods described herein.

Memory 1320 may comprise read only memory (ROM), random access memory (RAM), magnetic disk storage media devices, optical storage media devices, flash memory devices, electrical, optical, or other physical/tangible memory storage devices. Thus, in general, the memory 1320 may comprise one or more tangible (non-transitory) computer readable storage media (e.g., a memory device) encoded with software comprising computer executable instructions and when the software is executed (by the processor(s) 1310) it is operable to perform the operations described herein. Memory 1320 may store control logic 1325 to perform the above-described operations described above.

In addition, memory 1320 stores data 1350 used and generated by the processor 1310 when executing the logic described above.

In summary, in one aspect, a method is provided comprising: at a soft-input soft-output decoder to decode a soft information input vector represented by an input vector that is binary and that is constructed from the soft information input vector: storing even parity error vectors that are binary and odd parity error vectors that are binary for L least reliable bits (LRBs) of the input vector; computing a parity check of the input vector; selecting as error vectors either the even parity error vectors or the odd parity error vectors based at least in part on the parity check; hard decoding test vectors, representing respective sums (e.g., bitwise XOR) of the input vector and respective ones of the error vectors, based on the L LRBs, to produce codewords that are binary for corresponding ones of the test vectors, and metrics associated with the codewords; and updating the soft information input vector based on the codewords and the metrics.

In another aspect, an apparatus is provided comprising: a network interface unit; and a processor coupled to the network interface unit and configured to perform soft-input soft-output decoding of a soft information input vector represented by an input vector that is binary and that is constructed from the soft information input vector, the processor configured to perform the decoding by: storing even parity error vectors that are binary and odd parity error vectors that are binary for L least reliable bits (LRBs) of the input vector; computing a parity check of the input vector; selecting as error vectors either the even parity error vectors or the odd parity error vectors based at least in part on the parity check; hard decoding test vectors, representing respective sums of the input vector and respective ones of the error vectors, based on the L LRBs, to produce codewords that are binary for corresponding ones of the test vectors, and metrics associated with the codewords; and updating the soft information input vector based on the codewords and the metrics.

In yet another aspect, a computer readable medium is provided. The computer readable medium is encoded with instructions that, when executed by a processor configured to implement a soft-input soft-output decoder to decode a soft information input vector represented by an input vector that is binary and that is constructed from the soft information input vector, cause the processor to perform: storing even parity error vectors that are binary and odd parity error vectors that are binary for L least reliable bits (LRBs) of the input vector; computing a parity check of the input vector; selecting as error vectors either the even parity error vectors or the odd parity error vectors based at least in part on the parity check; hard decoding test vectors, representing respective sums of the input vector and respective ones of the error vectors, based on the L LRBs, to produce codewords that are binary for corresponding ones of the test vectors, and metrics associated with the codewords; and updating the soft information input vector based on the codewords and the metrics.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method performed at a receiver, comprising:
   receiving a transmitted codeword from a communication channel;
   deriving a soft information input vector representative of the transmitted codeword; and
   soft-input soft-output (SISO) decoding the soft information input vector represented by an input vector that is binary and that is constructed from the soft information input vector, the SISO decoding including:
      storing predetermined even parity error vectors that are binary and predetermined odd parity error vectors that are binary for L least reliable bits (LRBs) of the input vector;
      computing a parity check of the input vector;
      selecting as error vectors either the even parity error vectors or the odd parity error vectors based at least in part on the parity check so as to obtain a reduced number of test vectors;
      hard decoding the test vectors, representing respective sums of the input vector and respective ones of the error vectors, based on the L LRBs, to produce codewords that are binary for corresponding ones of the test vectors, and metrics associated with the codewords; and
      updating the soft information input vector based on the codewords and the metrics.

2. The method of claim 1, wherein the SISO decoding further comprises:
   prior to the hard decoding, determining the L LRBs of the input vector based on the soft information input vector.

3. The method of claim 1, wherein the transmitted codeword is part of a block code having a correction capability T, and the selecting includes selecting either the even parity error vectors or the odd parity error vectors based on the parity check and the correction capability T.

4. The method of claim 3, wherein the selecting includes:
   when the parity check is even and the correction capability T is an even number, selecting the even parity error vectors; and
   when the parity check is odd and the correction capability T is an odd number, selecting the even parity error vectors.

5. The method of claim 3, wherein the selecting further includes:
   when the parity check is even and the correction capability T is an odd number, selecting the odd parity error vectors; and
   when the parity check is odd and the correction capability T is an even number, selecting the odd parity error vectors.

6. The method of claim 1, wherein the soft input soft output decode SISO decoding includes improved Chase decoding of a block code, the improved Chase decoding having a reduced complexity as a result of the reduced number of the test vectors to be hard decoded from $2^L$ to $\leq 2^L/2$.

7. The method of claim 1, wherein a number of the even parity error vectors and a number of the odd parity error vectors are each $\leq 2^L/2$, such that the selecting produces $\leq 2^L/2$ selected error vectors, and the hard decoding includes hard decoding $\leq 2^L/2$ test vectors.

8. The method of claim 1, wherein the odd parity error vectors are a subset of odd parity error vectors selected from $2^L/2$ odd parity error vectors based on a bit error correction performance criterion, such that odd parity error vectors in the subset of odd parity error vectors provide improved bit error correction performance compared to ones of the $2^L/2$ odd parity error vectors that are not in the subset of odd parity error vectors.

9. The method of claim 1, wherein the updating the soft information input vector includes:
   updating the soft information input vector using best and second best codewords among the codewords and respective metrics for the best and second best codewords.

10. The method of claim 9, wherein the updating the soft information input vector further includes updating the soft information input vector based on a Pyndiah Update rule.

11. The method of claim 10, wherein the best and second best codewords are denoted $y_b$ and $y_c$, respectively, such that subscripts b and c denote association with the best and second best codewords, respectively, and the Pyndiah Update rule includes updating an nth soft information bit $\gamma_n$ of the soft information input vector, denoted $x=[\gamma_1, \ldots, \gamma_N]$ according to:
   setting a normalization factor $\zeta = \max(0, c_1 - c_2 * M_b)$; and
   setting:
   $$\gamma_n = \gamma_n^{ch} + \alpha * \zeta * ((M_b - M_c) * (2 * y_{n,b} - 1) - \gamma_n) \text{ if } y_{n,b} \neq y_{n,c},$$
   or
   $$\gamma_n = \gamma_n^{ch} + \beta * \zeta * (2 * y_{n,b} - 1) \text{ if } y_{n,b} = y_{n,c},$$
   where
   $c_1, c_2, \alpha,$ and $\beta$ are constants,
   $M_b, M_c$ are the respective metrics for the best and second best codewords $y_b, y_c$,
   $\gamma_n^{ch}$ represents an nth bit of original soft channel information, and
   $y_{n,b}$ or $y_{n,c}$ represents an nth bit of the best or second best codeword.

12. An apparatus comprising:
   a network interface unit configured to receive a transmitted codeword from a communication channel; and
   a processor coupled to the network interface unit and configured to perform:
      deriving a soft information input vector from the transmitted codeword; and
      soft-input soft-output decoding of the soft information input vector represented by an input vector that is binary and that is constructed from the soft information input vector, the processor configured to perform SISO decoding by:
         storing predetermined even parity error vectors that are binary and predetermined odd parity error vectors that are binary for L least reliable bits (LRBs) of the input vector;
         computing a parity check of the input vector;
         selecting as error vectors either the even parity error vectors or the odd parity error vectors based at least in part on the parity check so as to obtain a reduced number of test vectors;

hard decoding the test vectors, representing respective sums of the input vector and respective ones of the error vectors, based on the L LRBs, to produce codewords that are binary for corresponding ones of the test vectors, and metrics associated with the codewords; and updating the soft information input vector based on the codewords and the metrics.

13. The apparatus of claim 12, wherein the processor is configured to perform:

prior to the hard decoding, determining the L LRBs of the input vector based on the soft information input vector.

14. The apparatus of claim 12, wherein the transmitted codeword is part of a block code having a correction capability T, and the processor is configured to perform selecting by selecting either the even parity error vectors or the odd parity error vectors based on the parity check and the correction capability T.

15. The apparatus of claim 12, wherein a number of the even parity error vectors and a number of the odd parity error vectors are each $\leq 2^L/2$, such that the selecting produces $\leq 2^L/2$ selected error vectors, and the processor is configured to perform the hard decoding by hard decoding $\leq 2^L/2$ test vectors.

16. The apparatus of claim 12, wherein the odd parity error vectors are a subset of odd parity error vectors selected from $2^L/2$ odd parity error vectors based on a bit error correction performance criterion, such that odd parity error vectors in the subset of odd parity error vectors provide improved bit error correction performance compared to ones of the $2^L/2$ odd parity error vectors that are not in the subset of odd parity error vectors.

17. The apparatus of claim 12, wherein the processor is configured to perform the updating the soft information by updating the soft information using a Pyndiah Update rule based on best and second best codewords denoted $y_b$ and $y_c$, where subscripts b and c denote association with the best and second best codewords, respectively, and the Pyndiah Update rule includes updating an nth soft information bit $\gamma_n$ of the soft information input vector, denoted $x=[\gamma_1, \ldots, \gamma_N]$ according to:

setting a normalization factor $\zeta=\max(0, c_1-c_2*M_b)$; and setting:

$\gamma_n=\gamma_n^{ch}+\alpha*\zeta*((M_b-M_c)*(2*y_{n,b}-1)-\gamma_n)$ if $y_{n,b} \neq y_{n,c}$, or $\gamma_n=\gamma_n^{ch}+\beta*\zeta*(2*y_{n,b}-1)$ if $y_{n,b}=y_{n,c}$, where $c_1$, $c_2$, $\alpha$, and $\beta$ are constants, $M_b$, $M_c$ are the respective metrics for the best and second best codewords $y_b$, $y_c$, $\gamma_n^{ch}$ represents an nth bit of original soft channel information, and $y_{n,b}$ or $y_{n,c}$ represents an nth bit of the best or second best codeword.

18. A non-transitory computer readable medium encoded with instructions that, when executed by a processor of a receiver configured to receive a transmitted codeword from a communication channel, cause the processor to perform:

deriving a soft information input vector from the transmitted codeword; and soft-input soft-output (SISO) decoding of the soft information input vector represented by an input vector that is binary and that is constructed from the soft information input vector, wherein SISO decoding includes:

storing predetermined even parity error vectors that are binary and predetermined odd parity error vectors that are binary for L least reliable bits (LRBs) of the input vector;

computing a parity check of the input vector;

selecting as error vectors either the even parity error vectors or the odd parity error vectors based at least in part on the parity check so as to obtain a reduced number of test vectors;

hard decoding the test vectors, representing respective sums of the input vector and respective ones of the error vectors, based on the L LRBs, to produce codewords that are binary for corresponding ones of the test vectors, and metrics associated with the codewords; and updating the soft information input vector based on the codewords and the metrics.

19. The non-transitory computer readable medium of claim 18, wherein the transmitted codeword is part of a block code having a correction capability T, and the instructions to cause the processor to perform selecting include instructions to cause the processor to perform selecting either the even parity error vectors or the odd parity error vectors based on the parity check and the correction capability T.

20. The non-transitory computer readable medium of claim 18, wherein the instructions to cause the processor to perform updating the soft information include instructions to cause the processor to perform updating the soft information using a Pyndiah Update rule based on best and second best codewords denoted $y_b$ and $y_c$, where subscripts b and c denote association with the best and second best codewords, respectively, and the Pyndiah Update rule includes updating an nth soft information bit $\gamma_n$ of the soft information input vector, denoted $x=[\gamma_1, \ldots, \gamma_N]$ according to:

setting a normalization factor $\zeta=\max(0, c_1-c_2*M_b)$; and setting:

$\gamma_n=\gamma_n^{ch}+\alpha*\zeta*((M_b-M_c)*(2*y_{n,b}-1)-\gamma_n)$ if $y_{n,b} \neq y_{n,c}$, or $\gamma_n=\gamma_n^{ch}+\beta*\zeta*(2*y_{n,b}-1)$ if $y_{n,b}=y_{n,c}$, where $c_1$, $c_2$, $\alpha$, and $\beta$ are constants, $M_b$, $M_c$ are the respective metrics for the best and second best codewords $y_b$, $y_c$, $\gamma_n^{ch}$ represents an nth bit of original soft channel information, and $y_{n,b}$ or $y_{n,c}$ represents an nth bit of the best or second best codeword.

* * * * *

UNITED STATES PATENT AND TRADEMARK OFFICE
CERTIFICATE OF CORRECTION

| | |
|---|---|
| PATENT NO. | : 11,184,035 B2 |
| APPLICATION NO. | : 16/815624 |
| DATED | : November 23, 2021 |
| INVENTOR(S) | : Mohammad Ali Sedaghat et al. |

It is certified that error appears in the above-identified patent and that said Letters Patent is hereby corrected as shown below:

In the Claims

Claim 4, Column 13, Line 52, please replace "Tis" with --T is--

Claim 5, Column 13, Line 63, please replace "Tis" with --T is--

Signed and Sealed this
Twenty-fifth Day of October, 2022

Katherine Kelly Vidal
*Director of the United States Patent and Trademark Office*